(12) United States Patent
Yang et al.

(10) Patent No.: US 12,205,894 B2
(45) Date of Patent: Jan. 21, 2025

(54) ROUTING PATTERN (71) Applicant: MACRONIX INTERNATIONAL CO., LTD., Hsinchu (TW)

(72) Inventors: Chin-Cheng Yang, Kaohsiung County (TW); Yun-Chu Lin, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 456 days.

(21) Appl. No.: 17/697,074

(22) Filed: Mar. 17, 2022

(65) Prior Publication Data

US 2023/0298997 A1 Sep. 21, 2023

(51) Int. Cl.
*H01L 23/528* (2006.01)

(52) U.S. Cl.
CPC .................................. *H01L 23/528* (2013.01)

(58) Field of Classification Search
CPC ............ H01L 23/528; H01L 21/76802; H01L 27/0207; H01L 23/50; H01L 23/482; H01L 23/483; H01L 23/481; H05K 1/00; H05K 1/02; H05K 3/32
See application file for complete search history.

(56) References Cited

U.S. PATENT DOCUMENTS

| | | | |
|---|---|---|---|
| 6,412,097 B1 | 6/2002 | Kikuchi et al. | |
| 7,087,844 B2 | 8/2006 | Ishimaru et al. | |
| 7,432,581 B2 | 10/2008 | Kanamoto et al. | |
| 10,515,850 B2 | 12/2019 | Wang et al. | |
| 10,804,141 B2 | 10/2020 | Lin et al. | |
| 2003/0183004 A1* | 10/2003 | Furukubo | G01P 15/08 73/493 |
| 2004/0007778 A1* | 1/2004 | Shinozaki | H01L 24/11 257/E23.021 |
| 2010/0187573 A1* | 7/2010 | Iwata | H01L 27/0207 257/204 |
| 2015/0021782 A1* | 1/2015 | Kodama | G06F 30/394 257/773 |
| 2015/0110383 A1 | 4/2015 | Yang et al. | |
| 2020/0144391 A1* | 5/2020 | Eom | H01L 21/76816 |

FOREIGN PATENT DOCUMENTS

| | | |
|---|---|---|
| CN | 1630068 A | 6/2005 |
| TW | 200636907 A | 10/2006 |
| TW | 201806107 A | 2/2018 |
| TW | 201913836 A | 4/2019 |

* cited by examiner

*Primary Examiner* — Galina G Yushina
(74) *Attorney, Agent, or Firm* — McClure, Qualey & Rodack, LLP (57) ABSTRACT

A routing pattern is provided. The routing pattern includes a first routing region, a second routing region and an interconnection region. The first routing region includes a plurality of first conductive lines extending along a first direction. The plurality of first conductive lines has a first pitch along a second direction perpendicular to the first direction. The second routing region includes a plurality of second conductive lines extending along the first direction. The plurality of second conductive lines has a second pitch along the second direction, and the second pitch is approximately equal to the first pitch. The interconnection region includes two body parts and a connecting part connecting to the body parts. The body parts are disposed separately along the first direction. A width of the connecting part along the second direction is smaller than a width of the body parts along the second direction.

19 Claims, 10 Drawing Sheets

ROUTING PATTERN

BACKGROUND

Technical Field

The present disclosure relates to a routing pattern, and more particularly to a routing pattern on a semiconductor wafer.

Description of the Related Art

The photolithography process is one of the important processes in integrated circuits (ICs) fabrication. The photolithography process can be applied to transfer the routing pattern from the photo-mask to the photoresist layer on the surface of the semiconductor wafer in a certain proportion, and then transfer the routing pattern of the integrated circuit to the semiconductor wafer. The above-mentioned process of forming the routing pattern may further include cleaning steps using fluids and drying steps to remove residues left by the various processing steps.

However, with the increasing complexity and integration of integrated circuits, the line width and space of routing pattern gets smaller and smaller. The routing patterns with fine (small) line widths and spaces are likely to collapse, thereby reducing product reliability and yield.

It is important to improve the problem of pattern collapse.

SUMMARY

The present disclosure relates to a routing pattern, which can improve the problem of pattern collapse and increase process window for manufacturing a routing pattern.

According to an embodiment of the present disclosure, a routing pattern is provided. The routing pattern includes a plurality of linear features and an interconnection feature between two of the plurality of linear features. The linear features extend along a first direction and have a first line width along a second direction perpendicular to the first direction. The interconnection feature includes a recess curving inwards along the second direction. The interconnection feature has a second line width along the second direction. The first line width is smaller than the second line width.

According to an embodiment of the present disclosure, a routing pattern is provided. The routing pattern includes a first routing region, a second routing region and an interconnection region. The first routing region includes a plurality of first conductive lines extending along a first direction. The plurality of first conductive lines has a first pitch along a second direction perpendicular to the first direction. The second routing region includes a plurality of second conductive lines extending along the first direction. The plurality of second conductive lines has a second pitch along the second direction, and the second pitch is approximately equal to the first pitch. The interconnection region includes two body parts and a connecting part connecting to the body parts. The body parts are disposed separately along the first direction. A width of the connecting part along the second direction is smaller than a width of the body parts along the second direction.

The above and other embodiments of the disclosure will become better understood with regard to the following detailed description of the non-limiting embodiment(s). The following description is made with reference to the accompanying drawings.

DETAILED DESCRIPTION

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

Embodiments of the present disclosure can be applied to various routing patterns. For example, the embodiments can be applied to (but not limited to) conductive wires in the inter-layer dielectric layer or on the inter-layer dielectric layer. For example, the routing pattern may be formed in the first metal layer (ML1), the second metal layer (ML2) and/or the third metal layer (ML3) of the semiconductor structure.

Figure 1:
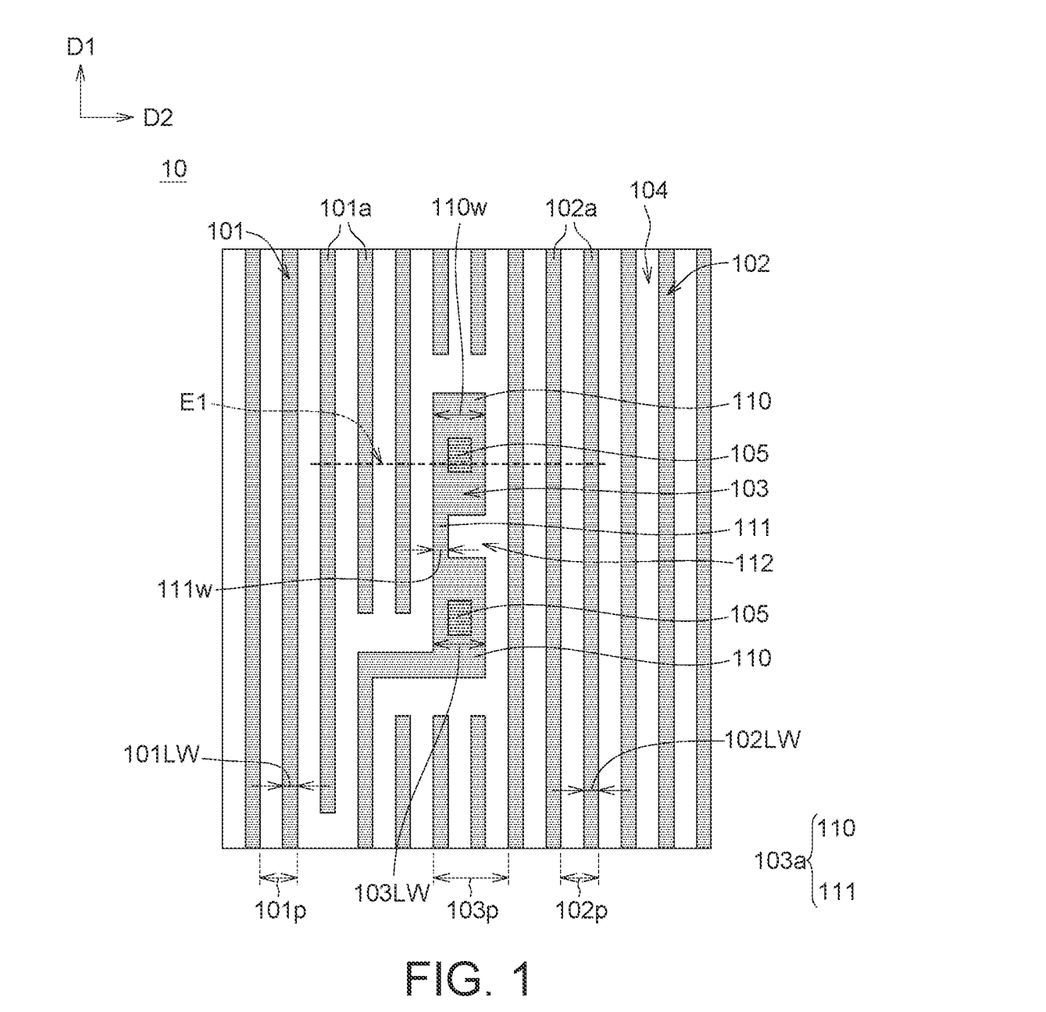
FIG. 1 illustrates a top view of a routing pattern according to the first embodiment of the present disclosure.

Referring to FIG. 1, FIG. 1 illustrates a top view of a routing pattern 10 according to the first embodiment of the present disclosure. The routing pattern 10 includes a routing region 101, a routing region 102 and an interconnection region 103. The interconnection region 103 may be between the routing region 101 and the routing region 102.

The routing region 101 may include a plurality of linear features 101a extending along a first direction D1. The linear features 101a may be disposed separately. The routing region 102 may include a plurality of linear features 102a extending along a first direction D1. The linear features 102a may be disposed separately. The interconnection region 103 may include an interconnection feature 103a. The interconnection feature 103a may be between the linear feature 101a and the linear feature 102a. The interconnection feature 103a includes a recess 112. The recess 112 may be a lateral recess curving inwards along the second direction D2. The second direction D2 is perpendicular to the first direction D1. In this embodiment, as shown in FIG. 1, an opening of the recess 112 faces toward the routing region 102 along the second direction D2. In another embodiment, the opening of the recess 112 may face toward the routing region 101 along the second direction D2.

Specifically, the interconnection feature 103a of the interconnection region 103 may include two body parts 110 and a connecting part 111 between the body parts 110. The body parts 110 may be disposed separately along the first direction D1. The body parts 110 may be disposed in a non-overlap manner in the second direction D2. The connecting part 111 may connect to the body parts 110. The body part 110 may have a width 110w along the second direction D2, the connecting part 111 may have a width 111w along the second direction D2, and the width 111w of the connecting part 111 may be smaller than the width 110w of the body part 110. The recess 112 can be defined by the width difference between the body parts 110 and the connecting part 111 of the interconnection feature 103a.

The linear features 101a include a line width 101LW along the second direction D2. A pitch 101p along the second direction D2 can be defined between two adjacent linear features 101a of the plurality of the linear features 101a. The linear features 102a include a line width 102LW along the second direction D2. A pitch 102p along the second direction D2 can be defined between two adjacent linear features 102a of the plurality of the linear features 102a. In an embodiment, the line widths of each of the linear features 101a are approximately the same; the line widths of each of the linear features 102a are approximately the same. In an embodiment, the pitches of the linear features 101a are approximately the same; the pitches of the linear features 102a are approximately the same. In an embodiment, the line width 101LW of the linear features 101a may be approximately equal to the line width 102LW of the linear features 102a. In an embodiment, the pitch 101p of the linear features 101a may be approximately equal to the pitch 102p of the linear features 102a. The interconnection feature 103a has a line width 103LW along the second direction D2. The line width 103LW of the interconnection feature 103a may be equal to the width 110w of the body part 110. A pitch 103p along the second direction D2 can be defined between the interconnection feature 103a and the adjacent linear feature (such as the linear feature 102a). In an embodiment, the line width 103LW of the interconnection feature 103a may be greater than the line width 101LW of the linear feature 101a and the line width 102LW of the linear feature 102a. In an embodiment, the pitch 103p of the interconnection feature 103a may be greater than the pitch 101p of the linear features 101a and the pitch 102p of the linear features 102a. In an embodiment, the pitch 101p and the pitch 102p may be smaller than or equal to 100 nanometers (nm). The linear feature 101a, the linear feature 102a and the interconnection feature 103a may include conductive materials such as metal. In an embodiment, the linear feature 101a and the linear feature 102a may be conductive lines.

The routing pattern 10 may include an insulating region 104. The insulating region 104 may be between the linear feature 101a, the linear feature 102a and the interconnection feature 103a. The insulating region 104 may include an insulating material such as oxide.

Figure 1A:
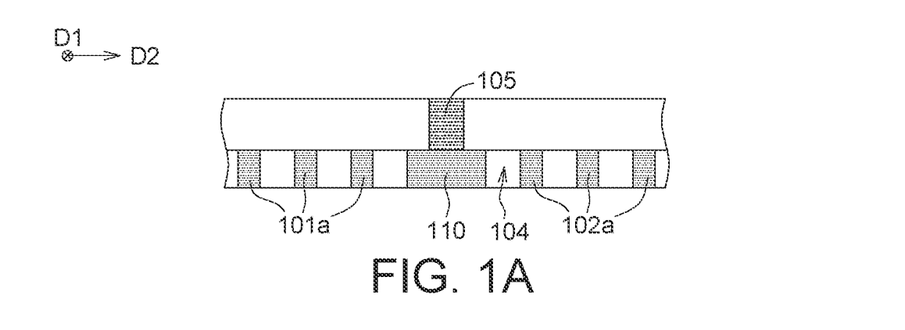
FIG. 1A is a schematic cross-sectional view of a routing pattern illustrating along an extending line E1 in FIG. 1.

Please referring to FIGS. 1 and 1A, FIG. 1A is a schematic cross-sectional view of a routing pattern 10 illustrating along an extending line E1 in FIG. 1. The routing pattern 10 may include two via elements 105 in the interconnection region 103. The via elements 105 may be disposed on opposite sides of the connecting part 111 of the interconnection feature 103a of the interconnection region 103. As shown in FIG. 1A, the via elements 105 may be on the body parts 110 of the interconnection feature 103a of the interconnection region 103 respectively, and the via elements 105 and the interconnection feature 103a may be in different layers. For example, the via elements 105 may be in a layer above the interconnection feature 103a and directly connected to the body parts 110. The via elements 105 may include conductive materials such as metal. In an embodiment, the via element 105 may be used to provide an inter-layer electrical connection. According to the present disclosure, the interconnection region of the routing pattern may have more than one interconnection features and/or interconnection feature with different type, which will be exemplified through the second to sixth embodiments below.

Figure 2:
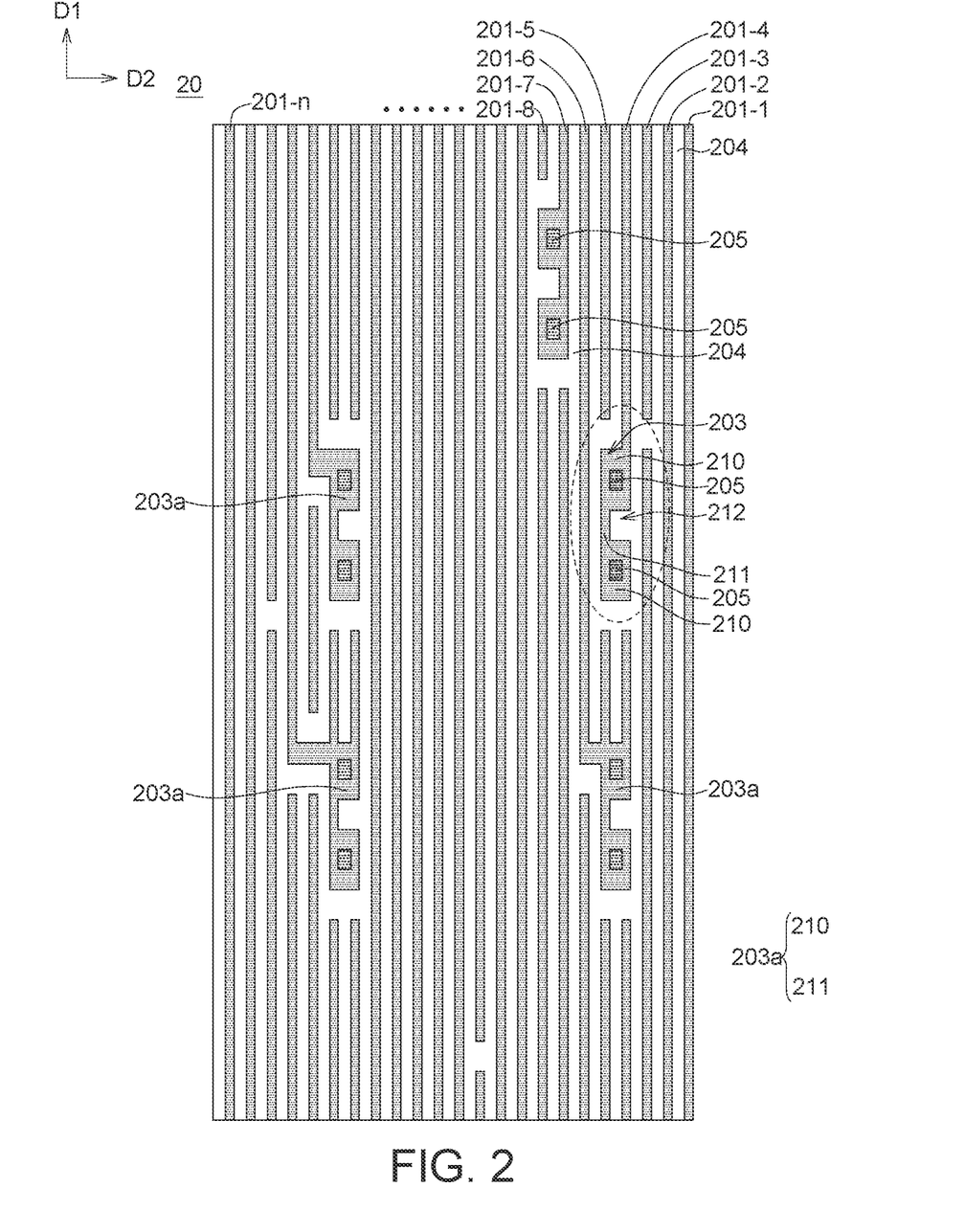
FIG. 2 illustrates a top view of a routing pattern according to the second embodiment of the present disclosure.
Figure 2A:
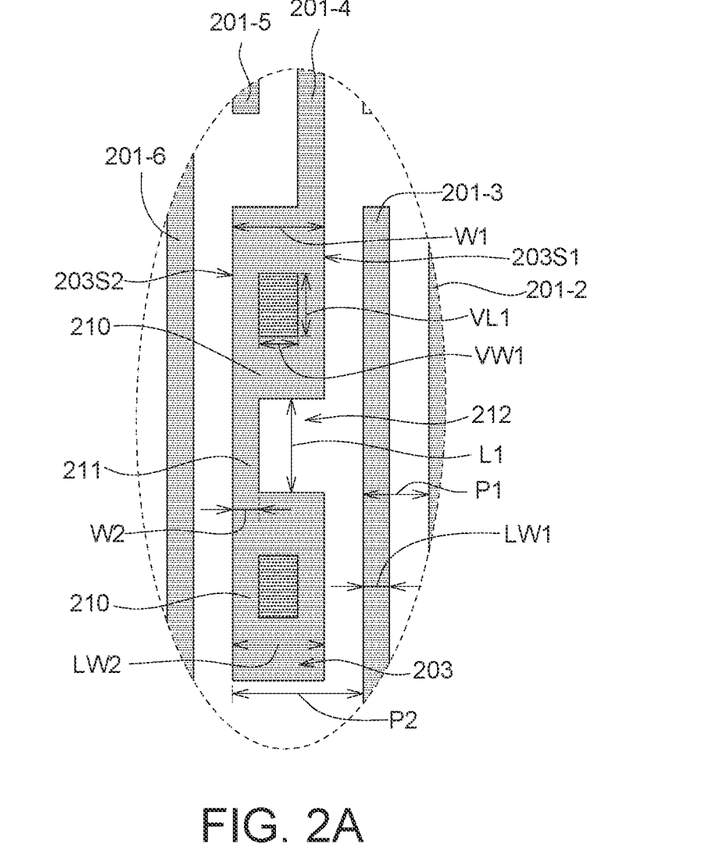
FIG. 2A is an enlarged view of the circled portion in FIG. 2.

Referring to FIGS. 2 and 2A, FIG. 2 illustrates a top view of a routing pattern 20 according to the second embodiment of the present disclosure, and FIG. 2A is an enlarged view of the circled portion in FIG. 2. The routing pattern 20 may include a plurality of linear features 201-1, 201-2, 201-3, 201-4, 201-5, 201-6, 201-7, 201-8 . . . 201-n extending along the first direction D1 and an interconnection region 203 between the linear features 201-1-201-n. For example, the linear features 201-1-201-n may be arranged substantially parallel to each other. Regions in the routing pattern 20 other than the interconnection region 203 can be understood as one or more routing regions.

The interconnection region 203 may include at least one interconnection feature 203a between any two of the linear features, for example, the interconnection feature 203a between the linear feature 201-3 and the linear feature 201-6, or the interconnection feature 203a between the linear feature 201-6 and the linear feature 201-9. The following description will take the interconnection feature 203a between the linear feature 201-3 and the linear feature 201-6 as an example, and other interconnection features 203a can be deduced by analogy.

The interconnection feature 203a includes a recess 212. The recess 212 may be a lateral recess curving inwards along the second direction D2. As shown in FIG. 2A, the recess 212 curves inwards from a first side 203S1 of the interconnection feature 203a toward a second side 203S2 of the interconnection feature 203a along the second direction D2, and the first side 203S1 is opposite to the second side 203S2. Specifically, the interconnection feature 203a of the interconnection region 203 may include two body parts 210 and a connecting part 211 between the body parts 210. The body parts 210 may be disposed separately along the first direction D1. The body parts 210 may be disposed in a non-overlap manner in the second direction D2. The connecting part 211 may connect to the body parts 210. A width W1 of the body part 210 along the second direction D2 may be greater than a width W2 of the connecting part 211 along the second direction D2. A recess 212 may be defined by the width difference between two body parts 210 and the connecting part 211 of the interconnection feature 203a. In an embodiment, a distance between a bottom of the recess 212 and the second side 203S2 along the second direction D2 is equal to the width W2 of the connecting part 211 along the second direction D2. The linear features 201-1-201-n and the interconnection feature 203a may include conductive materials such as metal. In an embodiment, the linear features 201-1-201-n may be conductive lines.

The routing pattern 20 may include two via elements 205 in the interconnection region 203. The via elements 205 may be on the body parts 210 of the interconnection feature 203a of the interconnection region 203 respectively and on opposite sides of the connecting part 211 of the interconnection feature 203a of the interconnection region 203. The via elements 205 may be disposed on opposite sides of the recess 212. The via elements 205 and the interconnection feature 203a may be in different layers. For example, the via elements 205 may be in a layer above the interconnection feature 203a and directly connected to the body parts 210.

The via elements 205 may include conductive materials such as metal. In an embodiment, the via element 205 may be used to provide an inter-layer electrical connection.

As shown in FIG. 2A, the linear feature 201-3 has a line width LW1 along the second direction D2. A pitch P1 along the second direction D2 can be defined between two adjacent linear features of the linear features 201-1-201-$n$ (for example, between the linear feature 201-2 and the linear feature 201-3). In an embodiment, the line widths of each of the linear features 201-1-201-$n$ are approximately the same; the pitches of the linear features 201-1-201-$n$ are approximately the same. The interconnection feature 203$a$ has a line width LW2 along the second direction D2. The line width LW2 of the interconnection feature 203$a$ may be equal to the width W1 of the body part 210. A pitch P2 along the second direction D2 can be defined between the interconnection feature 203$a$ and the adjacent linear feature (such as the linear feature 201-3). In an embodiment, the line width LW2 of the interconnection feature 203$a$ may be greater than the line width LW1 of the linear feature 201-3. In an embodiment, the pitch P2 may be greater than the pitch P1. The width W2 of the connecting part 211 may be greater than or equal to the line width LW1 of the linear feature 201-3. In an embodiment, the line width LW1 of the linear feature 201-3 may be smaller than or equal to 50 nm. The pitch P1 may be smaller than or equal to 100 nm. In an embodiment, the line width LW2 of the interconnection feature 203$a$ may be smaller than or equal to 150 nm. The present disclosure is not limited thereto.

The recess 212 of the interconnection feature 203$a$ has a recess length L1 along the first direction D1. For example, the recess length D1 may be between two times and four times the line width LW1 of the linear feature 201-3.

The via element 205 has a via length VL1 along the first direction D1. For example, the via length VL1 may be between two times and three times the line width LW1 of the linear feature 201-3. The via element 205 has a via width VW1 along the second direction D2. For example, the via width VW1 may be between one time and two times the line width LW1 of the linear feature 201-3. In an embodiment, the via width VW1 of the via element 205 is approximately 1.5 times the line width LW1 of the linear feature 201-3.

The routing pattern 20 may include an insulating region 204. The insulating region 204 may be between the linear features 201-1-201-$n$ and the interconnection feature 203$a$. The insulating region 204 may include an insulating material such as oxide.

Figure 3:
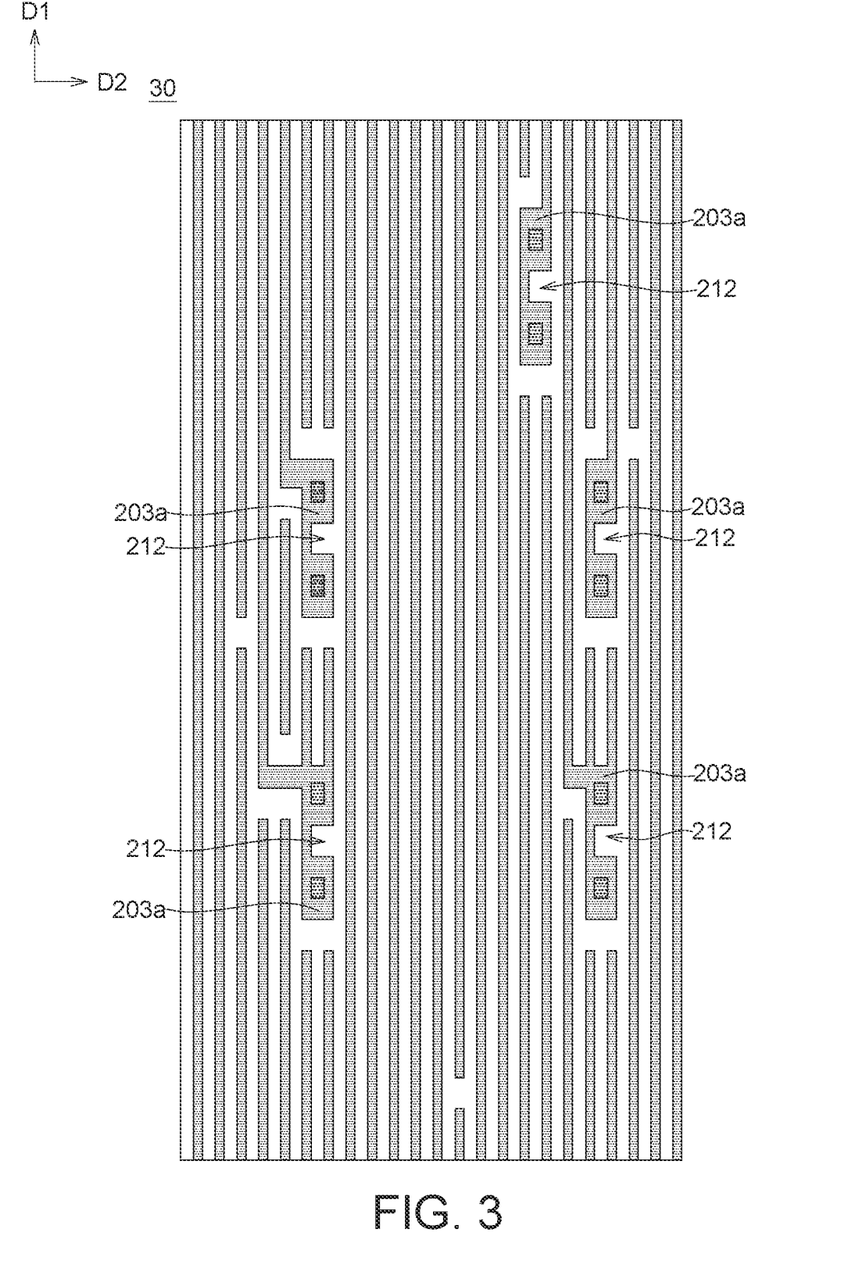
FIG. 3 illustrates a top view of a routing pattern according to the third embodiment of the present disclosure.

In an embodiment, the routing pattern 20 may include interconnection features including recesses whose openings face toward different directions. For example, in FIG. 2, the opening of the recess 212 of the interconnection feature 203$a$ between the linear feature 201-3 and the linear feature 201-6 faces toward positive second direction D2 (or may be understood as the right side of the figure), and the opening of the recess of the interconnection feature 203$a$ between the linear feature 201-6 and the linear feature 201-9 faces toward negative second direction D2 (or may be understood as the left side of the figure). The routing pattern of the present disclosure may include any number of interconnection features including recesses whose openings face toward different directions or any number of interconnection features including recesses whose openings face toward the same direction. For example, as shown in FIG. 3, the interconnection region 203 of the routing pattern 30 may include interconnection features 203$a$, and the openings of the recesses 212 of the interconnection features 203$a$ face toward the same direction.

Figure 4:
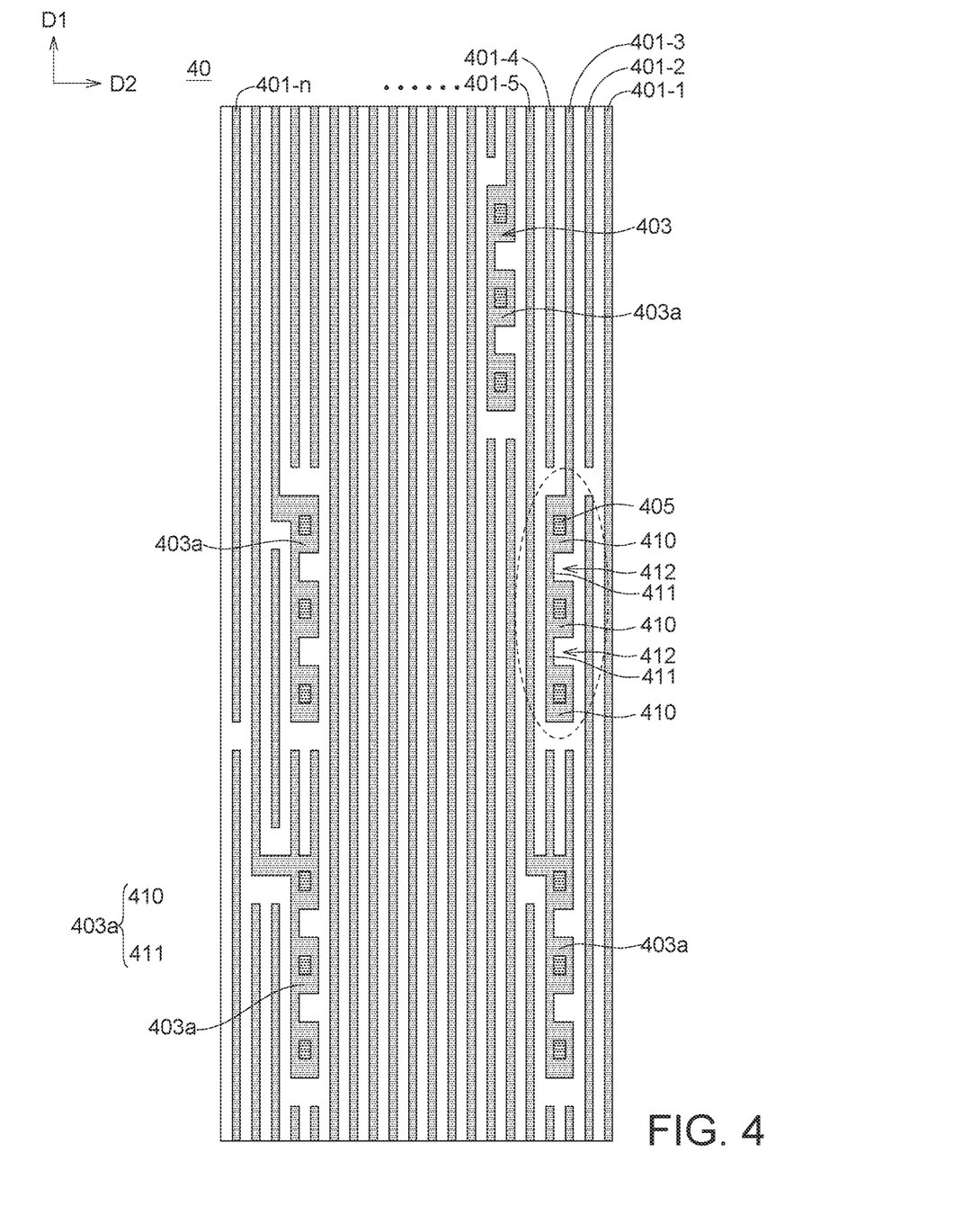
FIG. 4 illustrates a top view of a routing pattern according to the fourth embodiment of the present disclosure.
Figure 4A:
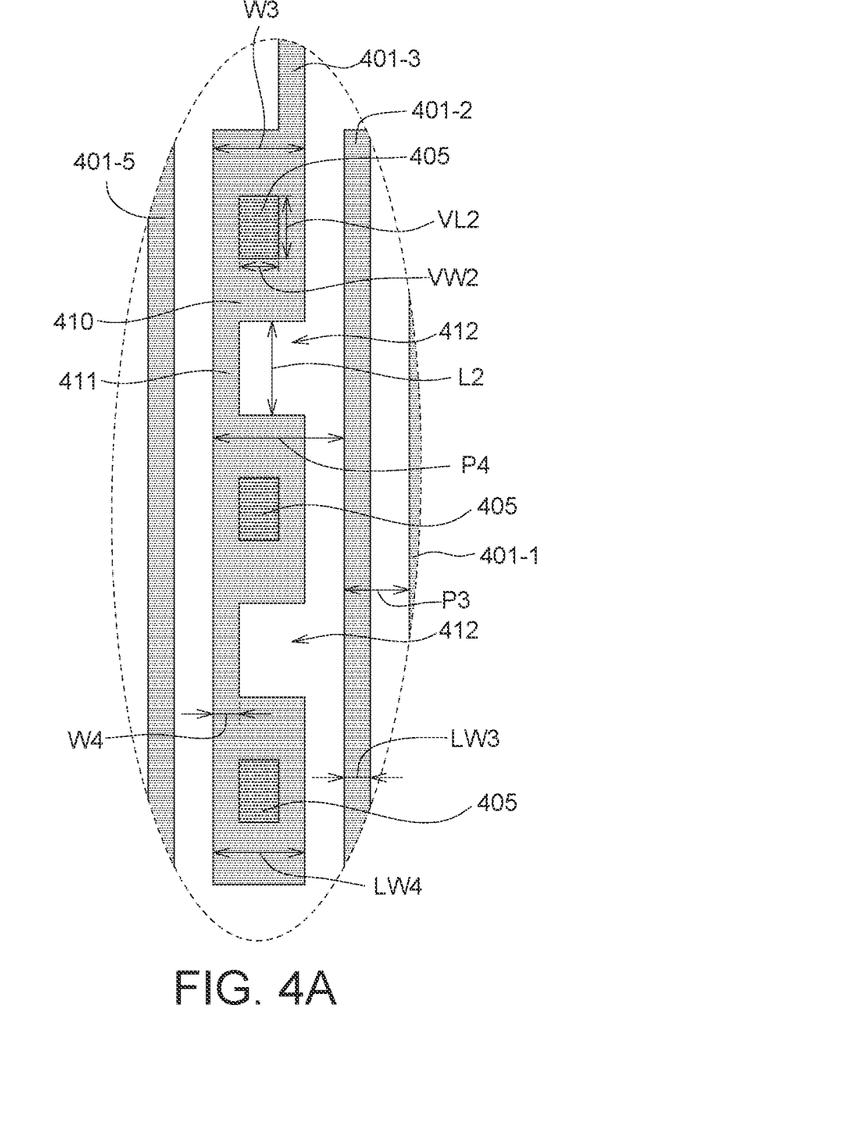
FIG. 4A is an enlarged view of the circled portion in FIG. 4.

Referring to FIGS. 4 and 4A, FIG. 4 illustrates a top view of a routing pattern 40 according to the fourth embodiment of the present disclosure, and FIG. 4A is an enlarged view of the circled portion in FIG. 4. The difference between the routing pattern 40 and the routing pattern 20 is that the number of the recesses included in each of the interconnection features 403$a$ of the interconnection region 403 in the routing pattern 40 is greater than the number of the recesses included in each of the interconnection features 203$a$ of the interconnection region 203 in the routing pattern 20, and the number of the via elements 405 on each of the interconnection features 403$a$ in the routing pattern 40 is greater than the number of the via elements 205 on each of the interconnection features 203$a$ in the routing pattern 20.

The routing pattern 40 may include a plurality of linear features 401-1, 401-2, 401-3 . . . 401-$n$ extending along the first direction D1 and an interconnection region 403 between the linear features 401-1-401-$n$. For example, the linear features 401-1~401-$n$ may be arranged substantially parallel to each other. In an embodiment, the linear features 401-1-401-$n$ may be conductive lines, and regions in the routing pattern 40 other than the interconnection region 403 can be understood as one or more routing regions. The linear features 401-1-401-$n$ of the routing pattern 40 may be similar to the linear features 201-1-201-$n$ of the routing pattern 20.

The interconnection region 403 may include at least one interconnection feature 403$a$ between any two of the linear features, for example, the interconnection feature 403$a$ between the linear feature 401-2 and the linear feature 401-5, or the interconnection feature 403$a$ between the linear feature 401-5 and the linear feature 401-8. The following description will take the interconnection feature 403$a$ between the linear feature 401-2 and the linear feature 401-5 as an example, and other interconnection features 403$a$ can be deduced by analogy. The interconnection feature 403$a$ includes two recesses 412. The recesses 412 may be lateral recesses curving inwards along the second direction D2. The recesses 412 may be disposed separately. The recesses 412 may be disposed in a non-overlap manner in the second direction D2. In this embodiment, the openings of the recesses 412 of the interconnection features 403$a$ face toward the same direction. The interconnection feature 403$a$ of the interconnection region 403 may include three body parts 410 and two connecting parts 411 between the body parts 410. Three body parts 410 may be disposed separately along the first direction D1. Three body parts 410 may be disposed in a non-overlap manner in the second direction D2. The connecting part 411 may connect to two adjacent body parts 410. As shown in FIG. 4A, a width W3 of the body part 410 along the second direction D2 may be greater than a width W4 of the connecting part 411 along the second direction D2. Two recesses 412 may be defined by the width difference between three body parts 410 and two connecting parts 411 of the interconnection region 403. The linear features 401-1-401-$n$ and the interconnection feature 403$a$ may include conductive materials such as metal. In an embodiment, the linear features 401-1-401-$n$ may be conductive lines.

The routing pattern 40 may include three via elements 405 in the interconnection region 403. Three via elements 405 may be on three body parts 410 of the interconnection feature 403$a$ of the interconnection region 403 respectively. The via elements 405 may be on opposite sides of the connecting parts 411 of the interconnection feature 403$a$ of the interconnection region 403. Three via elements 405 and two recesses 412 of the interconnection feature 403$a$ may be disposed alternately along the first direction D1. The via elements 403 and the interconnection feature 403a may be in different layers. For example, the via elements 405 may be in a layer above the interconnection feature 403a and directly connected to the body parts 410. The via elements 405 may include conductive materials such as metal. In an embodiment, the via element 405 may be used to provide an inter-layer electrical connection.

As shown in FIG. 4A, the linear feature 401-2 has a line width LW3 along the second direction D2. A pitch P3 along the second direction D2 can be defined between two adjacent linear features of the linear features 401-1-401-n (for example, between the linear feature 401-1 and the linear feature 401-2). In an embodiment, the line widths of each of the linear features 401-1-401-n are approximately the same; the pitches of the linear features 401-1-401-n are approximately the same. The interconnection feature 403a has a line width LW4 along the second direction D2. The line width LW4 of the interconnection feature 403a may be equal to the width W3 of the body part 410. A pitch P4 along the second direction D2 can be defined between the interconnection feature 403a and the adjacent linear feature (such as the linear feature 401-2). In an embodiment, the line width LW4 of the interconnection feature 403a may be greater than the line width LW3 of the linear feature 401-2. In an embodiment, the pitch P4 may be greater than the pitch P3. The width W4 of the connecting part 411 may be greater than or equal to the line width LW3 of the linear feature 401-2. In an embodiment, the line width LW3 of the linear feature 401-2 may be smaller than or equal to 50 nm. The pitch P3 may be smaller than or equal to 100 nm. In an embodiment, the line width LW4 of the interconnection feature 403a may be smaller than or equal to 150 nm. The present disclosure is not limited thereto.

The recess 412 of the interconnection feature 403a has a recess length L2 along the first direction D1. For example, the recess length D2 may be between two times and four times the line width LW3 of the linear feature 401-2. The sizes of two recesses 412 of the interconnection feature 403a may be the same or different.

The via element 405 has a via length VL2 along the first direction D1. For example, the via length VL2 may be between two times and three times the line width LW3 of the linear feature 401-2. The via element 405 has a via width VW2 along the second direction D2. For example, the via width VW2 may be between one time and two times the line width LW3 of the linear feature 401-2. In an embodiment, the via width VW2 of the via element 405 is approximately 1.5 times the line width LW3 of the linear feature 401-2.

Figure 5:
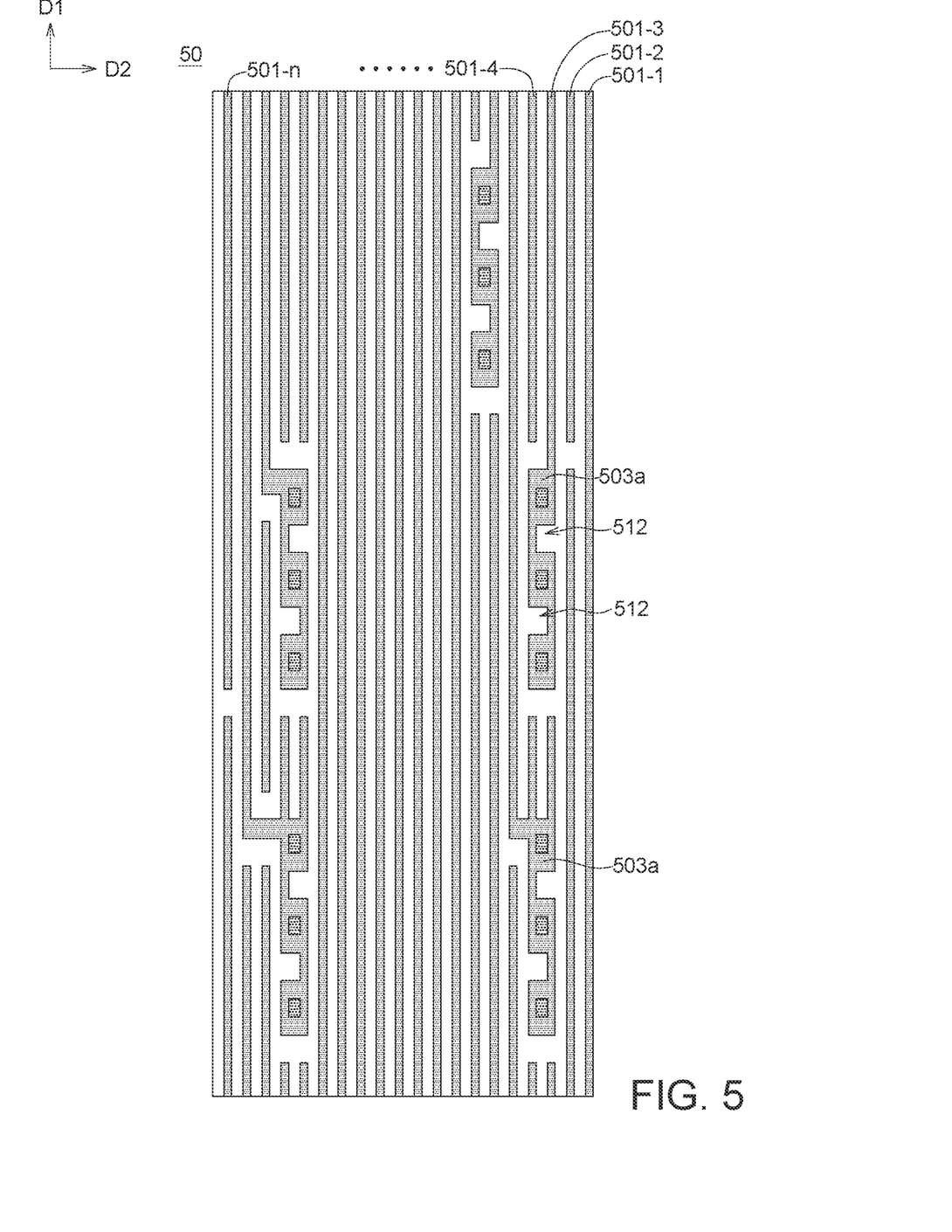
FIG. 5 illustrates a top view of a routing pattern according to the fifth embodiment of the present disclosure.

Referring to FIG. 5, FIG. 5 illustrates a top view of a routing pattern 50 according to the fifth embodiment of the present disclosure. The difference between the routing pattern 50 and the routing pattern 40 is that, two openings of two recesses 412 of single interconnection feature 403a of the routing pattern 40 face toward the same side, while two openings of two recesses 512 of single interconnection feature 503a of the routing pattern 50 face toward different sides.

The routing pattern 50 may include a plurality of linear features 501-1-501-n extending along the first direction D1 and an interconnection region 503 between the linear features 501-1-501-n. The linear features 501-1-501-n of the routing pattern 50 may be similar to the linear features 201-1-201-n of the routing pattern 20 and/or the linear features 401-1-401-n of the routing pattern 40. The interconnection region 503 may include at least one interconnection feature 503a between any two of the linear features.

The interconnection feature 503a includes two recesses 512. The recesses 512 may be lateral recesses curving inwards along the second direction D2. The openings of the recesses 512 face toward different directions. The recesses 512 may be disposed separately. The recesses 512 may be disposed in a non-overlap manner in the second direction D2.

Figure 6:
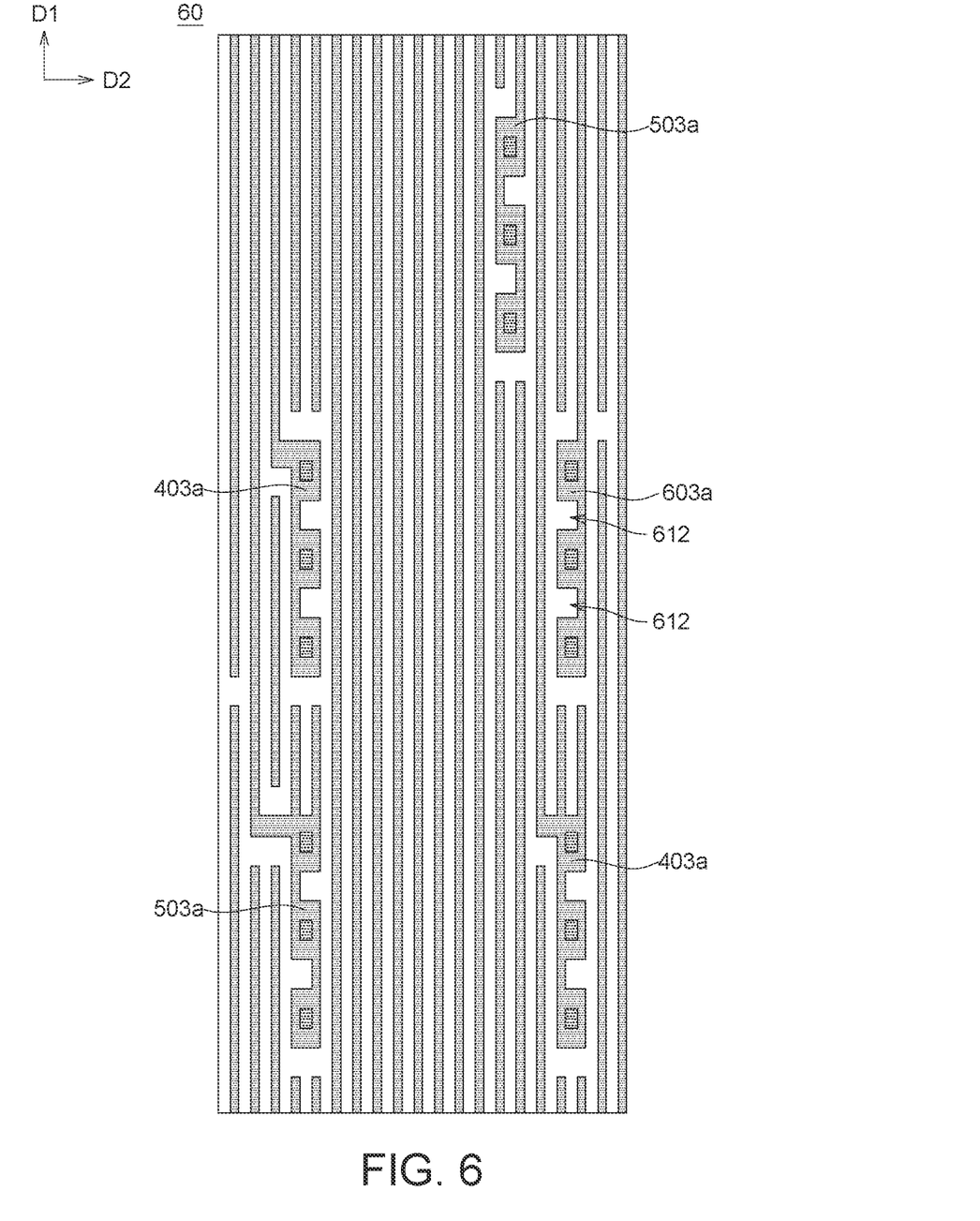
FIG. 6 illustrates a top view of a routing pattern according to the sixth embodiment of the present disclosure.

In an embodiment, the interconnection feature 403a included in the routing pattern 40 of FIG. 4 and the interconnection feature 503a included in the routing pattern 50 of FIG. 5 may be used together in a routing pattern, as shown in FIG. 6. FIG. 6 illustrates a top view of a routing pattern 60 according to the sixth embodiment of the present disclosure. In the embodiment shown in FIG. 6, the routing pattern 60 includes both the interconnection feature 403a (the openings of the recesses of the interconnection region 403 face toward the same side) and the interconnection feature 503a (the openings of the recesses of the interconnection region 503 face toward different sides). The routing pattern 60 may further include an interconnection feature 603a. The difference between the interconnection feature 603a and the interconnection feature 403a is that, the openings of two recesses 412 of the interconnection feature 403a faces toward positive second direction D2 (or may be understood as the right side of the figure), and the openings of two recesses 612 of the interconnection feature 603a faces toward negative second direction D2 (or may be understood as the left side of the figure). The routing pattern of the present disclosure may include a plurality of interconnection features arranged separately and between the plurality of linear features, and may include any combination of the above-mentioned different types of interconnection features (e.g. the interconnection feature 103a, 203a 403a, 503a, 603a).

FIGS. 7-12 illustrate a method for manufacturing a routing pattern according to an embodiment of the present disclosure.

Figure 7:
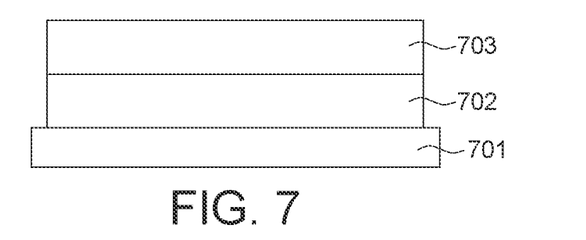
FIGS. 7-12 illustrate a method for manufacturing a routing pattern according to an embodiment of the present disclosure.

Referring to FIG. 7, an insulating layer 702 and a non-patterned photoresist layer 703 is formed on the substrate 701.

Figure 8:
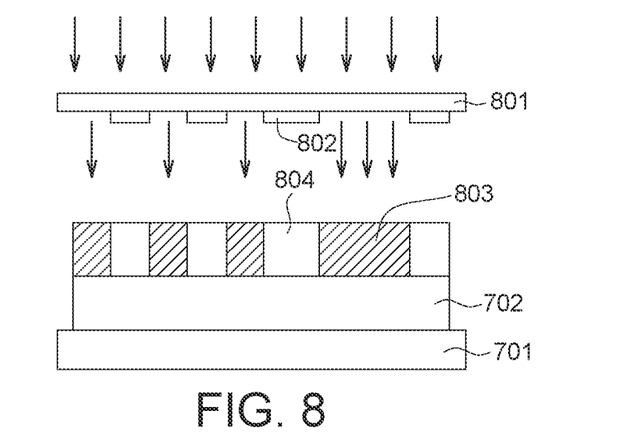
Figure 9:
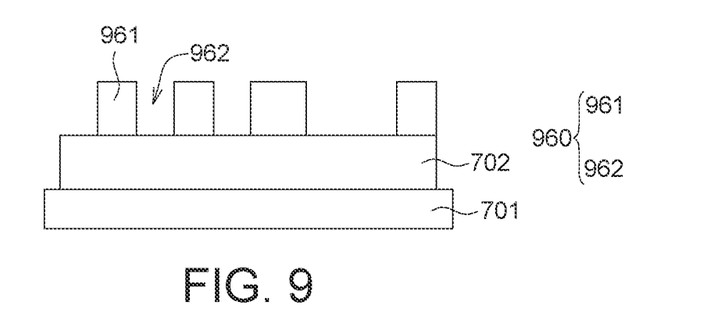

Referring to FIGS. 8-9, an exposure process and a developing process are performed. The exposure process is performed to the non-patterned photoresist layer 703 using a photo-mask 801 to form exposed regions 803 and unexposed regions 804 corresponding to the photo-mask pattern 802. After applying a suitable bake step, the exposed regions 803 and the unexposed regions 804 are treated with a developing agent. Then, a cleaning step and a drying step are performed to the exposed regions 803 and the unexposed regions 804 to remove the exposed regions 803. After the removal of the exposed regions 803, a plurality of linear photoresist features 961 (corresponding to the unexposed regions 804) and a plurality of trenches 962 (corresponding to the exposed regions 803) on the substrate 701 can be defined and a patterned photoresist layer 960 is formed.

Figure 10:
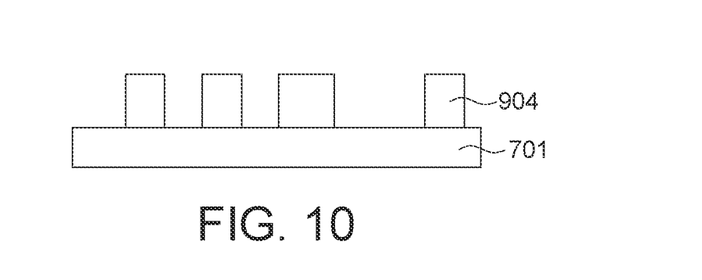
Figure 11:
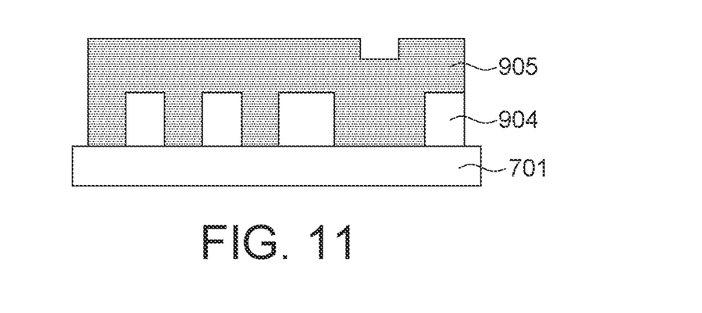
Figure 12:
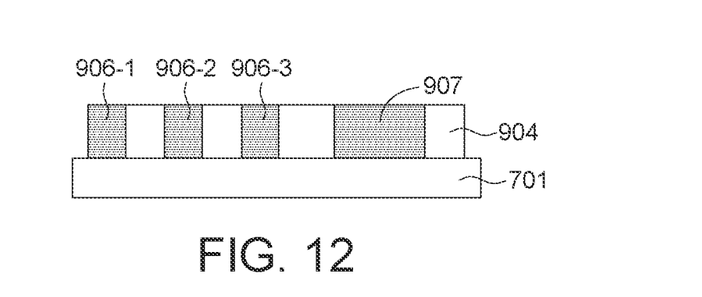

An etching process is performed to the insulating layer 702 through the trenches 962 of the patterned photoresist layer 960 to remove part of the insulating layer 702, the patterned photoresist layer 960 on the insulating layer 702 is removed (for example, by a photoresist dry stripping process or photoresist wet stripping process), and an insulating region 904 as shown in FIG. 10 is then formed. Referring to FIG. 11, a deposition process is performed to the structure shown in FIG. 10 to form a conductive material layer 905 on the insulating region 904. In an embodiment, the conductive material layer 905 may include copper. Next, a chemical-mechanical planarization process is performed to the structure shown in FIG. 11 to remove part of the conductive material layer 905. After removing part of the conductive material layer 905, linear patterns 906-1, 906-2 and 906-3 and an interconnection feature 907 are formed, as shown in FIG. 12.

In an embodiment, through the method schematically illustrated in FIGS. 7-12, the routing patterns shown in FIGS. 1-6 can be provided. The position of the linear photoresist features in the patterned photoresist layer may correspond to the position of the insulating region of the routing pattern. The position of the trenches in the patterned photoresist layer may correspond to the position of the linear feature and the interconnection feature of the routing pattern. The linear photoresist feature of the patterned photoresist layer may include a photoresist protrusion, and photoresist protrusion and the recess of the interconnection feature of the routing pattern may be complementary in shape.

A routing pattern usually includes a routing region having linear features or conductive lines arranged densely, and an interconnection region including an interconnection feature for disposing various semiconductor elements such as via elements. In order to arrange the semiconductor elements, the line width of the interconnection feature of the interconnection region is usually greater than the line width of the linear feature of the routing region. Such configuration with unequally line widths may cause photoresist pattern collapse problems during the photoresist developing process and drying process due to unbalanced force to the photoresist pattern. In addition, photoresist pattern collapse problems would reduce reliability and yield of electrical property.

According to the present disclosure, the interconnection feature of the routing pattern includes a recess, which can improve pattern collapse problems resulting from unbalanced force. Moreover, during the formation of the interconnection feature including the recess, the linear photoresist feature used to form the routing pattern includes a photoresist protrusion, and the photoresist protrusion and the recess of the interconnection feature of the routing pattern is complementary in shape; such configuration can avoid collapse of the linear photoresist feature due to unbalanced force on opposite sides of the linear photoresist feature (for example, the difference in liquid level of the cleaning solution between opposite sides of the linear photoresist feature in the dynamic drying process may result unbalanced force to the photoresist pattern), and the problem of poor routing pattern caused by pattern collapse can be avoided. Therefore, the present disclosure can reduce pattern collapse and increase the process window, product reliability and yield. The recess of the present disclosure only occupy a small area, that is, the protrusion of the present disclosure can solve the problem of pattern collapse without affecting the space for disposing the via elements, and is suitable for dense patterns, especially for fine patterns with a pitch smaller than or equal to 100 nm.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A routing pattern, comprising:
a first routing region comprising a plurality of first conductive lines extending along a first direction, wherein the plurality of first conductive lines has a first pitch along a second direction perpendicular to the first direction;
a second routing region comprising a plurality of second conductive lines extending along the first direction, wherein the plurality of second conductive lines has a second pitch along the second direction, the second pitch approximately equal to the first pitch; and
an interconnection region between the first routing region and the second routing region along the second direction and comprising an interconnection feature, wherein the interconnection feature comprises two body parts and a connecting part connecting to the body parts, the body parts are disposed separately along the first direction, a width of the connecting part along the second direction is smaller than a width of one of the body parts along the second direction, a line width of the interconnection feature along the second direction is greater than a line width of each of the plurality of first conductive lines along the second direction.

2. The routing pattern according to claim 1, wherein the body parts and the connecting part of the interconnection region define a recess, an opening of the recess faces toward the first routing region or the second routing region along the second direction.

3. The routing pattern according to claim 1, further comprising two via elements on the body parts of the interconnection region respectively.

4. The routing pattern according to claim 3, wherein the via elements are disposed on opposite sides of the connecting part.

5. The routing pattern according to claim 1, wherein the first pitch and the second pitch are smaller than or equal to 100 nm.

6. A routing pattern, comprising:
a plurality of linear features extending along a first direction and having a first line width along a second direction perpendicular to the first direction; and
an interconnection feature between two of the plurality of linear features and comprising a recess curving inwards along the second direction, wherein the interconnection feature has a second line width along the second direction, the first line width is smaller than the second line width,
wherein the interconnection feature comprises another recess curving inwards along the second direction, the another recess and the recess are non-overlapping in the second direction.

7. The routing pattern according to claim 6, wherein the interconnection feature comprises two body parts and a connecting part connecting to the body parts, the body parts are disposed separately along the first direction, a width of the connecting part along the second direction is smaller than a width of one of the body parts along the second direction.

8. The routing pattern according to claim 7, wherein the width of the body parts is equal to the second line width of the interconnection feature.

9. The routing pattern according to claim 6, wherein the recess of the interconnection feature curves inwards from a first side of the interconnection feature toward a second side of the interconnection feature along the second direction, the first side is opposite to the second side, a distance between a bottom of the recess and the second side is greater than or equal to the first line width.

10. The routing pattern according to claim 6, wherein the recess of the interconnection feature has a recess length along the first direction, the recess length is between two times and four times the first line width.

11. The routing pattern according to claim 6, further comprising two via elements on the interconnection feature, the via elements are disposed on opposite sides of the recess of the interconnection feature.

12. The routing pattern according to claim 11, wherein one of the via elements has a via length along the first direction, the via length is between two times and three times the first line width.

13. The routing pattern according to claim 11, wherein one of the via elements has a via width along the second direction, the via width is between one time and two times the first line width.

14. The routing pattern according to claim 13, wherein the via width is approximately 1.5 times the first line width.

15. The routing pattern according to claim 6, wherein an opening of the recess and an opening of the another recess face toward different directions.

16. The routing pattern according to claim 6, wherein an opening of the recess and an opening of the another recess face toward the same direction.

17. The routing pattern according to claim 6, further comprising three via elements on the interconnection feature, the via elements, the recess and the another recess of the interconnection feature are disposed alternately along the first direction.

18. The routing pattern according to claim 6, further comprising another interconnection feature between the plurality of linear features, wherein the interconnection feature and the another interconnection feature are arranged separately.

19. The routing pattern according to claim 6, wherein the first line width is smaller than or equal to 50 nm.

* * * * *